//  US 12,224,347 B2

United States Patent
Yang et al.

(10) Patent No.: US 12,224,347 B2
(45) Date of Patent: Feb. 11, 2025

(54) P-TYPE FIELD EFFECT TRANSISTOR (PFET) ON A SILICON GERMANIUM (GE) BUFFER LAYER TO INCREASE GE IN THE PFET SOURCE AND DRAIN TO INCREASE COMPRESSION OF THE PFET CHANNEL AND METHOD OF FABRICATION

(71) Applicant: QUALCOMM Incorporated, San Diego, CA (US)

(72) Inventors: Bin Yang, San Diego, CA (US); Xia Li, San Diego, CA (US); Haining Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 92 days.

(21) Appl. No.: 17/180,219

(22) Filed: Feb. 19, 2021

(65) Prior Publication Data

US 2022/0271162 A1    Aug. 25, 2022

(51) Int. Cl.
*H01L 29/78* (2006.01)
*H01L 21/8238* (2006.01)
(Continued)

(52) U.S. Cl.
CPC .. *H01L 29/7848* (2013.01); *H01L 21/823814* (2013.01); *H01L 27/092* (2013.01); *H01L 29/161* (2013.01); *H01L 29/66477* (2013.01)

(58) Field of Classification Search
CPC ........... H01L 29/0847; H01L 29/66795; H01L 29/1033; H01L 21/02535; H01L 29/66545
See application file for complete search history.

(56) References Cited

U.S. PATENT DOCUMENTS

| | | | |
|---|---|---|---|
| 2001/0029069 A1* | 10/2001 | Yamazaki | H01L 29/66765 257/E29.294 |
| 2006/0205167 A1 | 9/2006 | Kavalieros et al. | |

(Continued)

FOREIGN PATENT DOCUMENTS

| | | |
|---|---|---|
| EP | 2978017 A1 | 1/2016 |
| EP | 3624200 A1 | 3/2020 |

OTHER PUBLICATIONS

International Search Report and Written Opinion for International Patent Application No. PCT/US2022/012756, mailed Apr. 11, 2022, 17 pages.

*Primary Examiner* — Brian Turner
(74) *Attorney, Agent, or Firm* — Withrow & Terranova PLLC

(57) ABSTRACT

An exemplary high performance P-type field-effect transistor (PFET) fabricated on a silicon (Si) germanium (Ge) (SiGe) buffer layer with a SiGe source and drain having a Ge percentage higher than a threshold that causes dislocations at a Si substrate interface is disclosed. A source and drain including a Ge percentage above a 45% threshold provide increased compressive strain in the channel for higher performance of the PFET. Dislocations are avoided in the lattices of the source and drain by forming the PFET on a SiGe buffer layer rather than directly on a Si substrate and the SiGe buffer layer has a percentage of Ge less than a percentage of Ge in the source and drain. In one example, a lattice of the buffer layer is relaxed by implanting dislocations at an interface of the buffer layer and the Si substrate and annealing the buffer layer.

11 Claims, 10 Drawing Sheets

(51) Int. Cl.
*H01L 27/092* (2006.01)
*H01L 29/161* (2006.01)
*H01L 29/66* (2006.01)

(56) References Cited

U.S. PATENT DOCUMENTS

| | | | |
|---|---|---|---|
| 2006/0289900 A1* | 12/2006 | Thirupapuliyur | H01L 21/823814 |
| | | | 257/E29.085 |
| 2010/0224938 A1* | 9/2010 | Zhu | H01L 29/165 |
| | | | 438/285 |
| 2011/0175140 A1* | 7/2011 | Taylor | H01L 21/6719 |
| | | | 257/190 |
| 2012/0171829 A1* | 7/2012 | Tamura | H01L 29/6659 |
| | | | 257/E21.409 |
| 2012/0319211 A1 | 12/2012 | Van et al. | |
| 2013/0285153 A1* | 10/2013 | Lee | H01L 21/823821 |
| | | | 257/369 |
| 2014/0008700 A1* | 1/2014 | Rachmady | H01L 29/0673 |
| | | | 257/192 |
| 2014/0008730 A1* | 1/2014 | Mitard | H01L 21/823821 |
| | | | 257/369 |
| 2014/0070320 A1* | 3/2014 | Mukherjee | H01L 27/0886 |
| | | | 438/585 |
| 2014/0167120 A1* | 6/2014 | Chi | H01L 27/0886 |
| | | | 257/288 |
| 2016/0005864 A1* | 1/2016 | Kwon | H01L 29/0886 |
| | | | 257/190 |
| 2016/0027897 A1* | 1/2016 | Lee | H01L 21/02538 |
| | | | 438/285 |
| 2016/0035727 A1 | 2/2016 | Brunco | |
| 2016/0104775 A1* | 4/2016 | Yoo | H01L 29/1054 |
| | | | 257/190 |
| 2016/0336450 A1 | 11/2016 | Tak et al. | |
| 2017/0076973 A1* | 3/2017 | Lee | H01L 29/24 |
| 2017/0278968 A1* | 9/2017 | Lan | H01L 21/02535 |
| 2019/0035921 A1* | 1/2019 | Huang | H01L 29/7391 |
| 2020/0052116 A1 | 2/2020 | Kim et al. | |
| 2020/0126980 A1* | 4/2020 | Park | H01L 21/02222 |

\* cited by examiner

P-TYPE FIELD EFFECT TRANSISTOR (PFET) ON A SILICON GERMANIUM (GE) BUFFER LAYER TO INCREASE GE IN THE PFET SOURCE AND DRAIN TO INCREASE COMPRESSION OF THE PFET CHANNEL AND METHOD OF FABRICATION

BACKGROUND

I. Field of the Disclosure

The field of the disclosure relates generally to semiconductor devices and more particularly to fabricating high performance transistors on silicon substrates.

II. Background

Transistors are electrical devices that can switch and amplify electrical signals. Transistors are composed of semiconductor materials and have three or four terminals. A voltage or current applied to one terminal can change a current flow between other terminals. A field effect transistor (FET) is a type of transistor that consists of a source and a drain disposed at opposite sides of a channel, and an insulated gate disposed on the channel to apply an electric field that will change conductivity between the source and drain. The semiconductor material of the source, drain, and channel are typically intrinsic semiconductor materials doped with impurities that have a different number of valence electrons per atom than the semiconductor. The impurities are selected to increase concentrations of either electrons or holes in the composite lattice structure to increase electrical conductivity. The source and drain have a first type of doping and the channel is doped with the opposite type.

The addition of impurities can also increase or decrease the size of a semiconductor lattice structure. This size difference can be employed in a transistor to induce tensile stress or compressive strain on the channel. Tensile stress in a semiconductor lattice stretches the atoms, increasing separation between valence electrons and a nucleus, which increases mobility of electrons in the lattice structure. Alternatively, a compressive strain on a lattice structure increases hole mobility. These effects can be used in N-type FETs (NFETs) and P-type FETs (PFETs), respectively. However, extreme stresses or strains can create defects in the lattice structure and such defects can become paths for current leakage in a transistor.

SUMMARY OF THE DISCLOSURE

Aspects disclosed herein include a P-type field-effect transistor (PFET) on a silicon (Si) germanium (Ge) (SiGe) buffer layer to increase Ge in the PFET source and drain to increase compression of the PFET channel. Methods of fabricating the PFET on a SiGe buffer layer are also disclosed. PFETs include a P-type source and drain and an N-type channel in which holes are the majority carriers. Compressive strain applied to the molecular lattice of the N-type channel increases hole mobility in the N-type channel, which increases current flow in the channel. Compressive strain is applied from both ends of the channel by the source and drain which are formed of a SiGe lattice with a larger lattice constant than the Si lattice of the N-type channel. The lattice constant of the SiGe lattice is increased due to adding Ge to the Si and becomes larger as a Ge percentage increases. When the percentage of Ge in the SiGe lattice of the source and drain reaches a threshold level, such that a SiGe lattice constant is much larger than that of an Si substrate lattice constant, the SiGe lattice grown on the Si substrate develops dislocations at the lattice interface. Dislocations are defects in a lattice that provide a path for current leakage through the source and drain, which prevents current flow through the PFET from being fully shut off.

An exemplary high performance PFET is fabricated on a SiGe buffer layer with a SiGe source and drain having a Ge percentage higher than a threshold that causes dislocations at a Si substrate interface. A source and drain including a Ge percentage above a 45% threshold provide increased compressive strain in the channel for higher performance of the PFET. Dislocations are avoided in the lattices of the source and drain by forming the PFET on a SiGe buffer layer rather than directly on a Si substrate and the SiGe buffer layer has a percentage of Ge less than a percentage of Ge in the source and drain. In one example, a lattice of the buffer layer is relaxed by implantation to form dislocations at an interface of the buffer layer and the Si substrate and annealing the buffer layer. After the buffer layer lattice is relaxed, a mismatch in lattice size at the Si substrate interface does not create stress in a top surface of the buffer layer. The difference in size between the SiGe lattice of the buffer layer and the SiGe lattices of the source and drain does not cause dislocations to occur. Therefore, leakage current caused by dislocations is avoided, even when a percent of Ge in the epitaxial layers of the source and drain is at least forty-six (46) percent (%), and the PFET formed on a relaxed SiGe buffer layer achieves higher performance.

In an exemplary aspect, a semiconductor device comprising a silicon substrate, a buffer layer and a transistor is disclosed. The buffer layer is disposed on the silicon substrate and comprises a first percentage of Ge. The transistor is disposed on the buffer layer and comprises a channel region, a gate, a source, and a drain. The channel region comprises a semiconductor material. The gate is disposed on the channel region. The source is disposed on a first side of the channel region, and the drain is disposed on a second side of the channel region. The source and drain each comprise a SiGe composite comprising a second percentage of Ge greater than the first percentage, and the second percentage of Ge is at least forty-six (46) percent (%).

In another exemplary aspect, a method of fabricating a semiconductor device is disclosed. The method includes forming a buffer layer on a silicon substrate, the buffer layer comprising silicon and a first percentage of Ge. The method further comprises relaxing strain in the buffer layer and forming a semiconductor layer on the buffer layer. The method includes forming a first gate on the semiconductor layer. The method includes forming a first recess on a first side of the first gate and a second recess on a second side of the first gate, the first recess and the second recess each extending through the semiconductor layer to the buffer layer. The method includes forming a first composite of Si and Ge in the first recess and in the second recess, the first composite comprising a second percentage of Ge higher than the first percentage of germanium, the second percentage of Ge is at least forty-six (46) percent (%).

DETAILED DESCRIPTION

Figure 1:
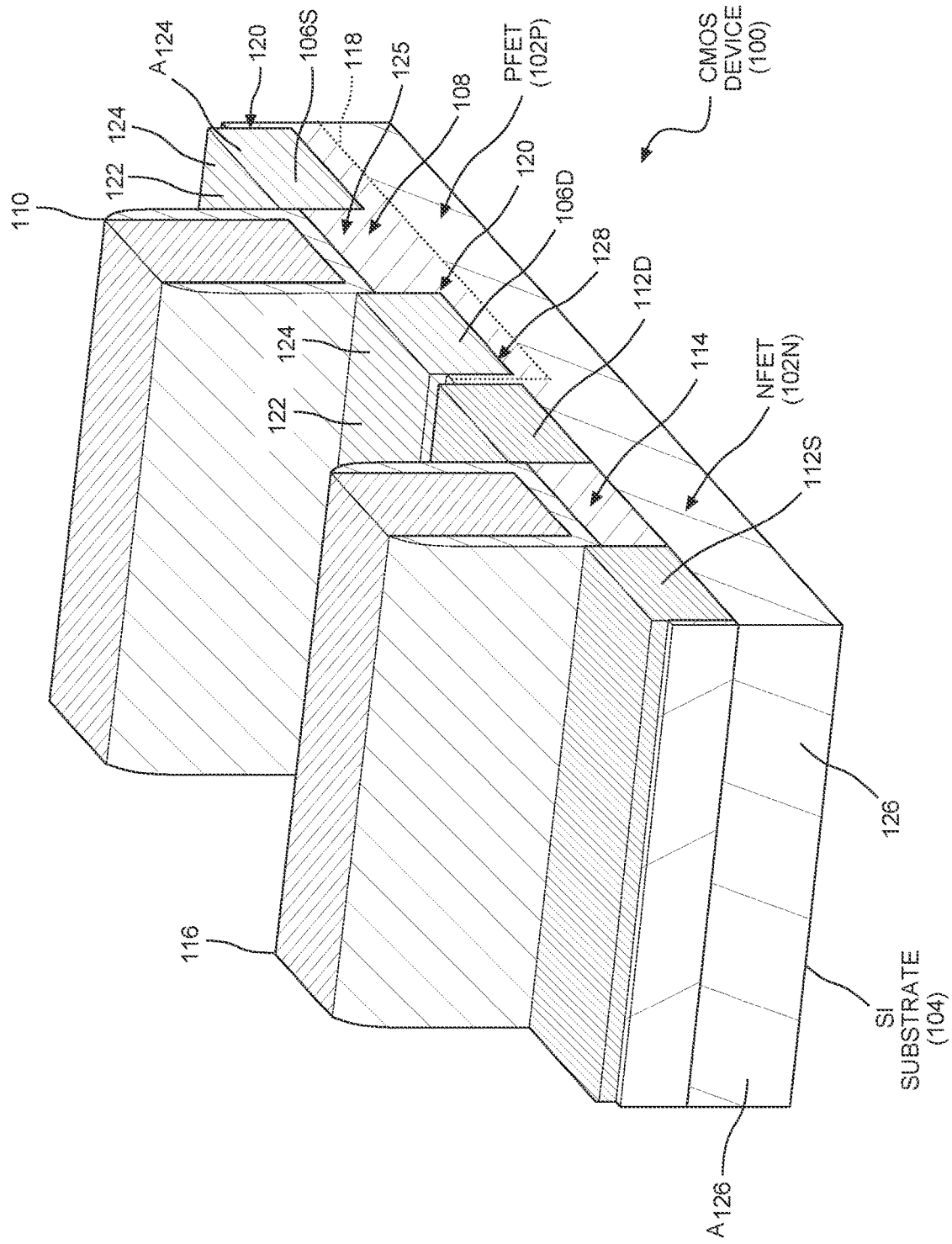
FIG. 1 is a three-dimensional perspective view of a complementary metal-oxide semiconductor (MOS) (CMOS) device including a P-type field effect transistor (FET) (PFET) and an N-type FET (NFET) formed on a silicon substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a P-type field-effect transistor (PFET) on a silicon (Si) germanium (Ge) (SiGe) buffer layer to increase Ge in the PFET source and drain to increase compression of the PFET channel. Methods of fabricating the PFET on a SiGe buffer layer are also disclosed. PFETs include a P-type source and drain and an N-type channel in which holes are the majority carriers. Compressive strain applied to the molecular lattice of the N-type channel increases hole mobility in the N-type channel, which increases current flow in the channel. Compressive strain is applied from both ends of the channel by the source and drain which are formed of a SiGe lattice with a larger lattice constant than the Si lattice of the N-type channel. The lattice constant of the SiGe lattice is increased due to adding Ge to the Si and becomes larger as a Ge percentage increases. When the percentage of Ge in the SiGe lattice of the source and drain reaches a threshold level, such that a SiGe lattice constant is much larger than that of an Si substrate lattice constant, the SiGe lattice grown on the Si substrate develops dislocations at the lattice interface. Dislocations are defects in a lattice that provide a path for current leakage through the source and drain, which prevents current flow through the PFET from being fully shut off.

An exemplary high performance PFET is fabricated on a SiGe buffer layer with a SiGe source and drain having a Ge percentage higher than a threshold that causes dislocations at a Si substrate interface. A source and drain including a Ge percentage above a 45% threshold provide increased compressive strain in the channel for higher performance of the PFET. Dislocations are avoided in the lattices of the source and drain by forming the PFET on a SiGe buffer layer rather than directly on a Si substrate and the SiGe buffer layer has a percentage of Ge less than a percentage of Ge in the source and drain. In one example, the strain of the SiGe buffer layer is relaxed by intentional implantation to generate dislocations in the SiGe buffer layer, followed by a high temperature anneal to recrystallize the SiGe buffer layer. As a result of these processing steps, dislocations generated in the SiGe buffer layer are trapped at the interface between the SiGe buffer layer and the Si substrate. After the buffer layer lattice is relaxed, a mismatch in lattice size at the Si substrate interface does not create stress in a top surface of the buffer layer. The difference in size between the SiGe lattice of the buffer layer and the SiGe lattices of the source and drain does not cause dislocations to occur. Therefore, leakage current caused by dislocations is avoided, even when a percent of Ge in the epitaxial layers of the source and drain is at least forty-six (46) percent (° %), and the PFET formed on a relaxed SiGe buffer layer achieves higher performance.

Before describing the exemplary P-type field-effect transistor (FET) (PFET) 200 in a complementary metal-oxide-semiconductor (MOS) (CMOS) device 202 in FIG. 2, an example of a conventional CMOS device 100 is described with reference to FIG. 1. FIG. 1 is a three-dimensional perspective view of the CMOS device 100 including a PFET 102P and an N-type FET (NFET) 102N formed on a silicon (Si) substrate 104. CMOS devices such as the CMOS device 100 are often employed in binary logic because the PFET 102P is better for passing a binary "1" (e.g., supply voltage $V_{DD}$) and the NFET 102N is better for passing a "0" (e.g., ground voltage $V_{SS}$).

Structurally, the PFET 102P includes a P-type source 106S and a P-type drain 106D on opposite sides of an N-type well 108. An insulated gate 110 is disposed on the N-type well 108. The NFET 102N includes an N-type source 112S and an N-type drain 112D on opposite sides of a P-type well 114. An insulated gate 116 is disposed on the P-type well 114, which is formed in the Si substrate 104. The insulated gate 116 may be metal or highly conductive polysilicon. The N-type well 108 is formed in an N-well 118 disposed in the Si substrate 104.

The P-type source and drain 106S and 106D of the PFET 102P are fabricated by etching out trenches 120 in the N-well 118 on both sides of the insulated gate 110 and growing a P-type semiconductor composite 122 in the trenches 120. The P-type semiconductor composite 122 is formed as a Si germanium (Ge) (SiGe) lattice 124. One of the best ways to enhance performance of PFETs is to increase hole mobility in a P-channel 125 that is induced in a top surface of the N-type well 108. Because the P-channel 125 is formed in the N-type well 108, the N-type well 108 is also referred to herein as a channel region 108. An increase in hole mobility can be achieved by employing a SiGe lattice 124 in the P-type source 106S and P-type drain 106N to provide compressive force on the N-type well 108.

The SiGe lattice structure is a combination of smaller Si atoms with larger Ge atoms, which results in a lattice larger than intrinsic Si. The SiGe lattice 124 has a lattice constant $A_{124}$ that is larger than a lattice constant $A_{126}$ of the Si lattice 126. The SiGe lattice 124 of the P-type semiconductor composite 122 is grown by epitaxy in the trenches 120 to form the P-type source 106S and P-type drain 106D and creates a compressive strain on opposite sides of the N-type well 108. The compressive strain increases the hole mobility in the P-channel 125 that is induced in the N-type well 108. However, if the percentage of Ge in the P-type semiconductor composite 122 is increased to a threshold, such that the lattice constant $A_{124}$ is much larger than the lattice constant $A_{126}$, dislocations form at an interface 128 of the SiGe lattice 124 and an Si lattice 126 of the Si substrate 104. A percentage of Ge as described herein is an atomic percent based on an atomic ratio of Ge atoms to total atoms. In practice, the threshold is a Ge percentage of 45%. The compressive strain provided by the P-type source 106S and P-type drain 106D in the CMOS device 100 is limited by this Ge percentage threshold.

Figure 2:
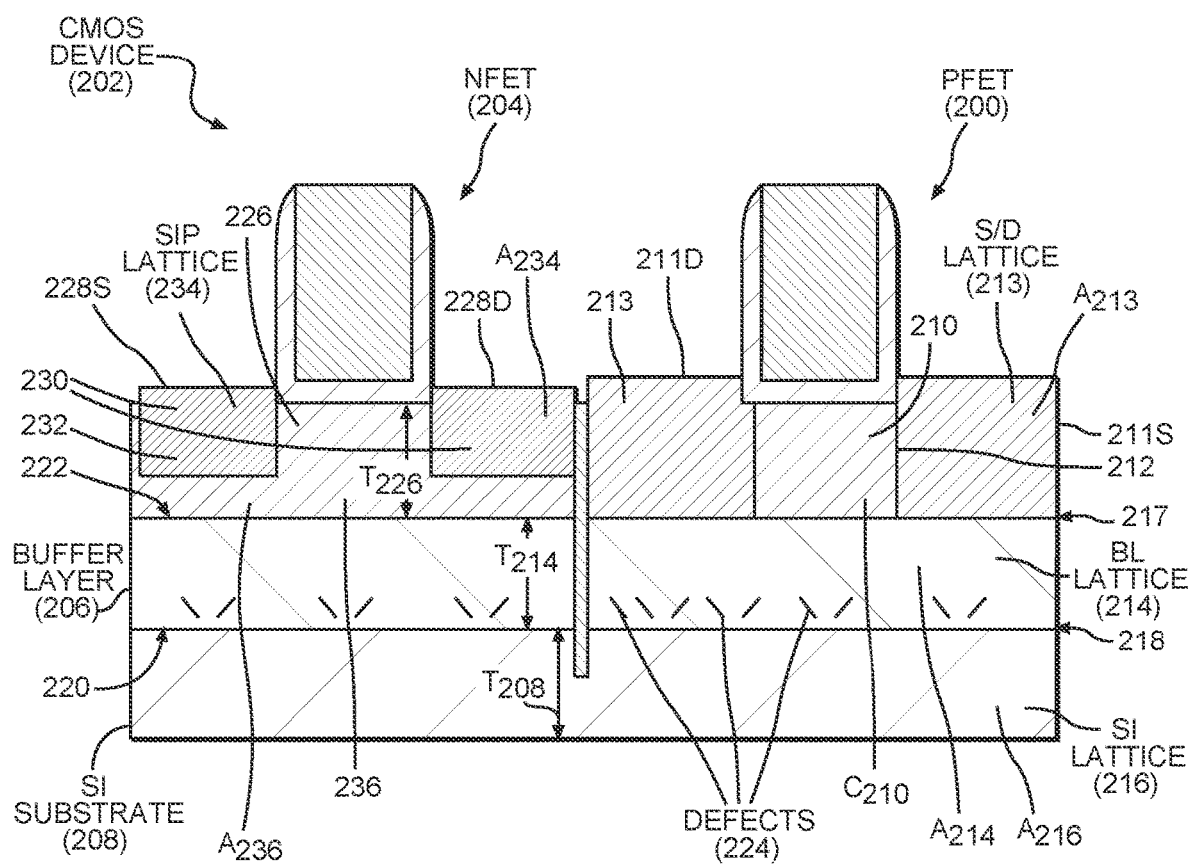
FIG. 2 is a cross-sectional side view of a CMOS device including a PFET and an NFET formed on a silicon (Si) germanium (Ge) (SiGe) composite buffer layer and including greater than 45% Ge in a SiGe composite in the PFET source and drain for increased performance.

FIG. 2 is a cross-sectional side view of an exemplary CMOS device 202 including the PFET 200 and an NFET 204 including a buffer layer 206 on a Si substrate 208. Performance of the PFET 200 is improved over the PFET 102P in FIG. 1 because greater compression of an N-type well 210 by a source 211S and a drain 211D increases hole mobility therein. The N-type well 210 is formed from a semiconductor layer 212 disposed on the buffer layer 206. The semiconductor layer 212 is doped with a pentavalent impurity to become an N-type material from which the N-type well 210 is formed. The N-type well 210 is also referred to herein as a channel region 210 because a P-channel (not shown) is formed in the N-type well 210 during operation of the PFET 200. The semiconductor layer 212 is removed from both sides of the N-type well 210 and the source 211S and drain 211D are formed on either side of the N-type well 210 where the semiconductor layer 212 has been removed. The source 211S and drain 211D are formed of epitaxial SiGe with a higher percentage of Ge than in the P-type source and drain 106S and 106D in FIG. 1 without creating dislocations. The higher percentage of Ge can be successfully employed because the source 211S and drain 211D are formed on the buffer layer 206, which is formed of SiGe with a lower percentage of Ge rather than being formed directly on the semiconductor layer 212.

Referring back to FIG. 1, dislocations are created at the interface 128 of the SiGe lattice 124 and the Si substrate 104 when the percentage of Ge in the SiGe lattice 124 reaches the Ge threshold (e.g., 45% Ge). This threshold indicates a point at which a difference between a size of the SiGe lattice 124 (e.g., of the P-type source 106S) and a size of the Si lattice 126 of the Si substrate 104 causes a mismatch that cannot be accommodated by compression or expansion of the respective lattices. When a difference in lattice constants of interfacing lattices becomes too great, dislocations occur at the interface. Thus, when a lattice constant $A_{124}$ of the SiGe lattice 124 becomes much larger than a lattice constant $A_{126}$ of the Si lattice 126 in FIG. 1, the mismatch cannot be accommodated and dislocations form.

To overcome the Ge percentage threshold in the PFET 200, the source 211S and drain 211D are formed on the buffer layer 206. The source 211S and drain 211D include an S/D lattice 213 with a lattice constant $A_{213}$. A BL lattice 214 of the buffer layer 206 has a lattice constant $A_{214}$, which is greater than a lattice constant $A_{216}$ of a Si lattice 216 of the Si substrate 208 but smaller than the lattice constant $A_{213}$ of the S/D lattice 213. With the BL lattice 214 between the Si lattice 216 and the S/D lattice 213, dislocations are avoided, as follows. A difference between the lattice constant $A_{214}$ of the BL lattice 214 and the lattice constant $A_{213}$ of the S/D lattice 213 is not large enough to cause dislocations at an upper interface 217 where the buffer layer 206 intersections with the source 211S and the drain 211D. Similarly, a difference between the lattice constant $A_{214}$ of the BL lattice 214 and the lattice constant $A_{216}$ of the Si lattice 216 is not large enough to cause dislocations at a lower interface 218 of the Si substrate 208 and the buffer layer 206.

In further detail, the BL lattice 214 is comprised of SiGe with a first percentage of Ge that is less than a second percentage of Ge in the source 211S and the drain 211D. In an example, the first percentage is in a range of 12 to 18 percent (e.g., atomic percent) Ge. In one example, the BL lattice 214 is 15% Ge. The BL lattice 214 with the lattice constant $A_{214}$ is larger than the Si lattice 216 of the Si substrate 208 with the lattice constant $A_{216}$ because Ge atoms are larger than Si atoms. The BL lattice 214 is disposed on the Si substrate 208 to a thickness $T_{214}$ of at least 1 micron, which is much less than a thickness $T_{208}$ of the Si substrate 208 of approximately 100 microns. The Si lattice 216 at a thickness $T_{208}$, much thicker than the thickness $T_{214}$, is much less flexible than the BL lattice 214 at thickness $T_{214}$. Thus, a difference between the lattice constants $A_{214}$ and $A_{216}$ forces the more flexible BL lattice 214 to be compressed at the lower interface 218 to adjust to the Si lattice 216. Compressive stresses or forces 220 on the BL lattice 214 at the lower interface 218 can be transmitted through the thickness $T_{214}$ to a top surface 222 at the upper interface 217 with the S/D lattice 213. The compressive forces 220 transferred to the top surface 222 of the BL lattice 214 would affect accommodation of the BL lattice 214 and the larger S/D lattice 213 at the upper interface 217. The effects of such compressive forces 220 are avoided by intentionally creating defects 224 by damaging the BL lattice 214 at the lower interface 218 to relieve compressive forces exerted on the BL lattice 214 caused by the mismatch with the Si lattice 216. The BL lattice 214 is fully relaxed (i.e., has minimal compressive or expansive stresses) at the top surface 222 as the BL lattice adjusts to the defects 224 during epitaxy. The BL lattice 214 being fully relaxed at the top surface 222 can better accommodate the S/D lattice 213 that is larger due to a higher percent of Ge. In an alternative to inserting defects, the compressive forces may be relieved by a superlattice structure (not shown) including alternating layers of Si and SiGe. The compressive forces 220 at the lower interface 218 do not continue through interfaces between layers of a superlattice structure and therefore are not present at the upper interface 217.

In this regard, the buffer layer 206 buffers (e.g., isolates) the S/D lattice 213 from the Si substrate 208, allowing the second Ge percentage of the S/D lattice 213 to exceed 45%. A limit to the second Ge percentage in the S/D lattice 213 depends on a difference between the lattice constant $A_{213}$ of the S/D lattice 213 and the lattice constant $A_{214}$ of the BL lattice 214. In some examples, the second percentage of Ge in the S/D lattice 213 is greater than 46%. In some examples, the second percentage of Ge in the S/D lattice 213 is greater than 60%. In some examples, the second percentage of Ge in the S/D lattice can be up to 100% (i.e., entirely Ge). Increasing the second percentage of Ge makes the S/D lattice 213 larger, which increases compression of the N-type well 210. An increase in compression improves conductivity $C_{210}$ through the N-type well 210, which increases performance of the PFET 200. Increasing the percentage of Ge by 10% in S/D lattice 213 can increase the performance of the PFET 200 by 5%.

In addition to providing an increase in performance of the PFET 200, the buffer layer 206 also provides a benefit to performance of the NFET 204. The NFET 204 includes a source 228S and drain 228D on either side of a P-type well 226. The P-type well 226 is also referred to herein as "channel region 226" because an N-channel (not shown) is formed therein during operation of the NFET 204. The P-type well 226 is formed from the semiconductor layer 212 doped with a trivalent impurity. The semiconductor layer 212 is removed from both sides of the P-type well 226 and the source 228S and drain 228D are formed on either side of the P-type well 226 where the semiconductor layer 212 has been removed. Electron mobility of the P-type well 226 (channel region 226) increases with tensile (pulling) stresses. To provide tensile stress to the P-type well 226 from each side, the source 228S and the drain 228D of the NFET 204 are formed of a composite 230 of Si and another element 232. In an example, the other element 232 in the composite 230 may be phosphorous (P). The composite 230 includes a silicon phosphorous (SiP) lattice 234. The element 232 is selected such that the lattice constant $A_{234}$ of the SiP lattice 234 in the source 228S and the drain 228D is smaller than a lattice constant $A_{236}$ of a P-well lattice 236 in the P-type well 226. Thus, the SiP lattice 234 of the source 228S and the drain 228D pull on each side of the P-type well 226.

The P-well lattice 236 of the P-type well 226 and has a lattice constant $A_{236}$ that is close in range to the lattice constant $A_{216}$ of the Si lattice 216. The P-type well 226 is disposed on the buffer layer 206 to a thickness $T_{226}$ of 100 to 500 angstroms. Due to the 15% Ge in the BL lattice 214, the lattice constant $A_{214}$ is larger than the lattice constant $A_{236}$ of the P-well lattice 236. Due to the BL lattice 214 being larger in size than the P-well lattice 236 and having greater thickness $T_{214}$ than the P-well lattice 236, the P-well lattice 236 is subject to additional tensile stress forcing the P-well lattice 236 to expand to accommodate the BL lattice 214. The additional tensile stresses exerted by the buffer layer 206 further increase electron mobility in the P-type well 226 to increase performance of the NFET 204. Thus, performance of both the PFET 200 and the NFET 204 are improved by incorporating the buffer layer 206 into the CMOS device 202.

Figure 3:
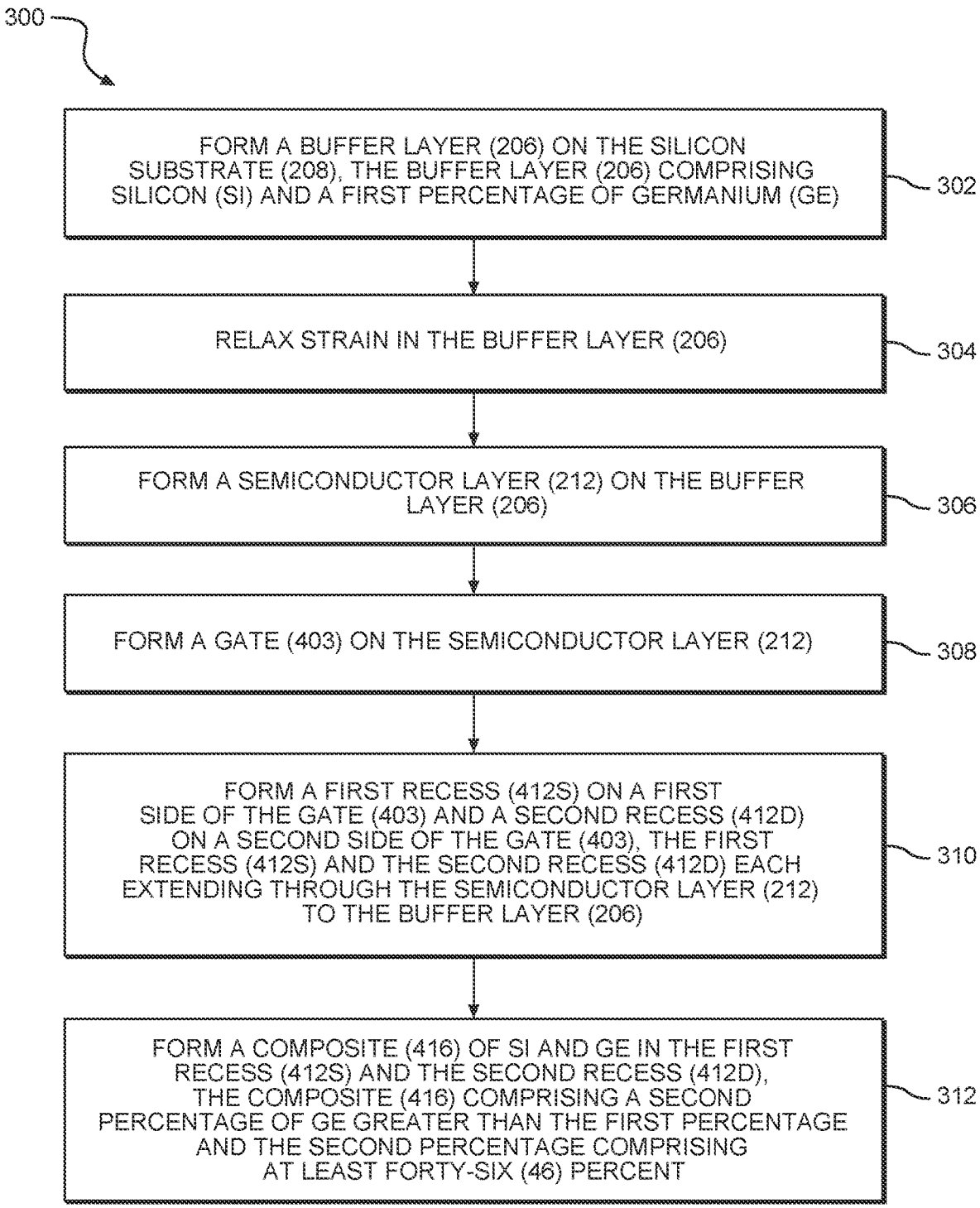
FIG. 3 is a flowchart of a method of fabricating the PFET and the NFET of a CMOS device formed on a buffer layer as illustrated in FIG. 2.
Figure 4A:
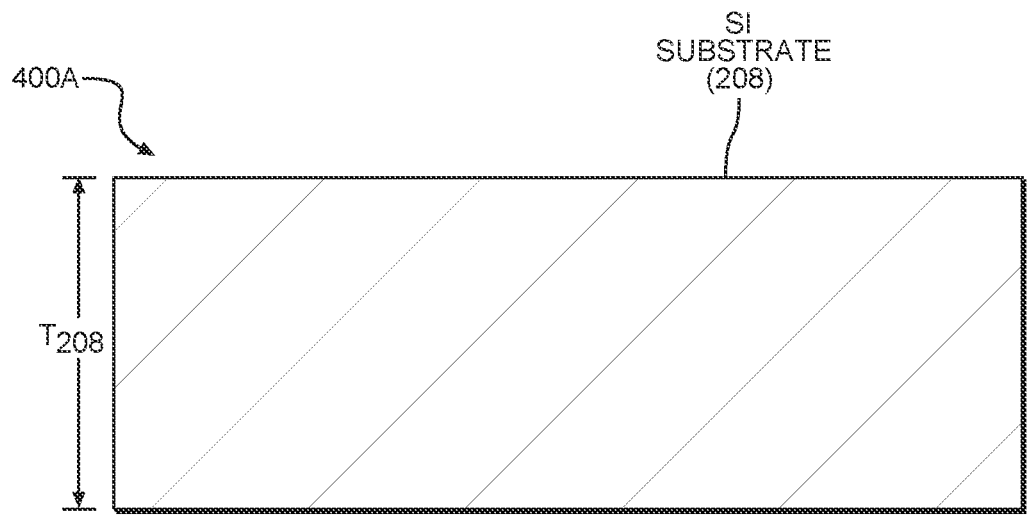
FIGS. 4A-4I are illustrations of fabrication stages in the method of fabricating the PFET and the NFET in the CMOS device in FIG. 2 as illustrated in the flowchart in FIG. 3.

FIG. 3 is a flowchart illustrating a method 300 of fabricating the CMOS device 202 including the PFET 200 and the NFET 204 on the buffer layer 206 for increased performance. The method 300 is described with reference to the fabrication stages 400A-400I in FIGS. 4A-4I. Features in the FIGS. 4A-4I corresponding to the CMOS device 202 in FIG. 2 are labeled as in FIG. 2. The first fabrication stage 400A illustrated in FIG. 4A includes the Si substrate 208 as shown in FIG. 2. The Si substrate 208 in this example has the thickness $T_{208}$ of about 100 microns but may be thinner or thicker.

Figure 4B:
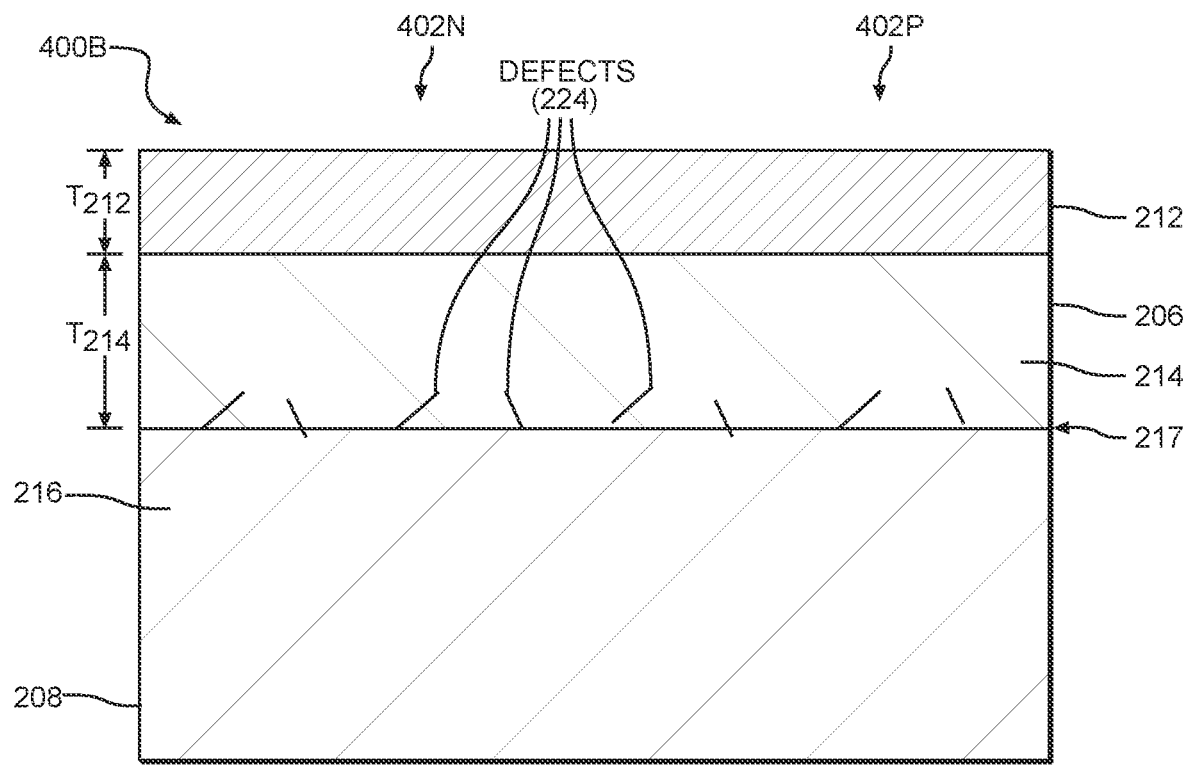

With reference to the second fabrication stage 400B illustrated in FIG. 4B, the method 300 includes forming a buffer layer 206 on the Si substrate 208, the buffer layer 206 comprising Si and a first percentage of Ge (block 302). The buffer layer 206 is formed to a thickness $T_{214}$ of at least 1 micron. In some examples, the thickness $T_{214}$ may be in the range from 0.9 to 1.5 microns, or greater. Due to a lattice mismatch between the Si lattice 216 of the Si substrate 208 and the BL lattice 214 of the buffer layer 206, the Si lattice 216 induces a compressive strain on the BL lattice 214 at the lower interface 218. Thus, the method 300 includes relaxing strain in the buffer layer 206 (block 304). In an example, relaxing strain in the buffer layer 206 includes creating defects 224 in the BL lattice 214 of the buffer layer 206 at the lower interface 218 of the buffer layer 206 and the Si substrate 208, and annealing (i.e., heat treating) the buffer layer 206.

The method 300 further includes forming the semiconductor layer 212 on the buffer layer 206 (block 306). In an example, forming the semiconductor layer 212 includes forming the semiconductor layer 212 to a thickness $T_{212}$ of 100 angstroms (A) to 500 A. In another example, forming the semiconductor layer 212 may further include doping the semiconductor layer 212. For example, in an area 402P of the semiconductor layer 212 in which the PFET 200 (not shown) is to be formed, the semiconductor layer 212 may be doped to be an N-type material by adding a pentavalent impurity (e.g., phosphorous (P), Arsenic (As), Antimony (Sb), etc.). In an area 402N of the semiconductor layer 212 in which the NFET 204 (not shown) is to be formed, the semiconductor layer 212 may be doped to be a P-type semiconductor by adding a trivalent impurity (e.g., Boron (B), Gallium (G), Indium (In), etc.).

Figure 4C:
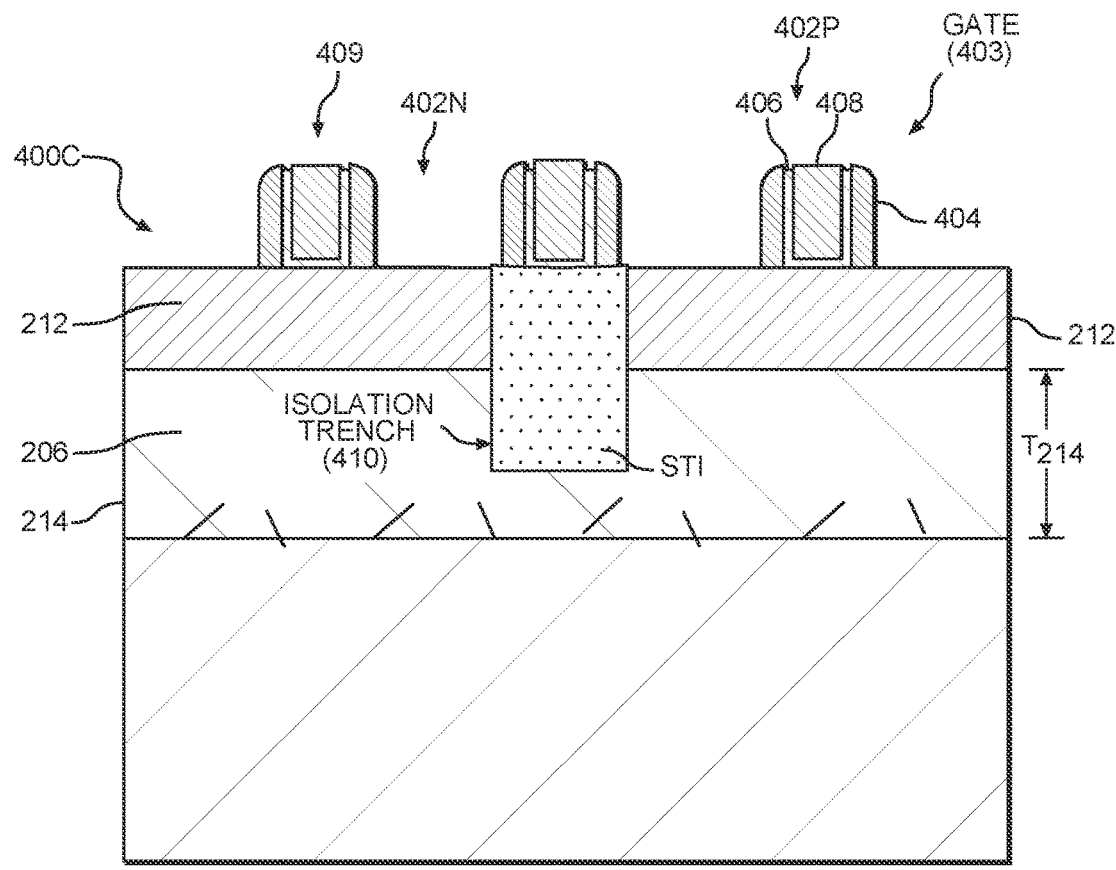

As shown in an illustration of the third fabrication stage 400C in FIG. 4C, the method 300 includes forming a gate 403 on the semiconductor layer 212 (block 308). In an example, the gate 403 is disposed in the area 402P of the semiconductor layer 212. Forming the gate 403 may include forming sidewalls 404, forming a dielectric layer 406, and forming a conductive gate 408. As shown in the illustration of the third fabrication stage 400C, the method may further include, in an example, forming a gate 409 on the semiconductor layer 212 in the area 402N for the NFET 204. The method 300 may further include forming an isolation trench 410 between the gate 403 and the gate 409, the isolation trench 410 extending through the semiconductor layer 212 and into the buffer layer 206 and filling the isolation trench 410 with a shallow trench isolation (STI) material, such as an insulator (e.g., silicon oxide). The isolation trench 410 extends through a portion of the thickness $T_{214}$ of the BL lattice 214.

Figure 4D:
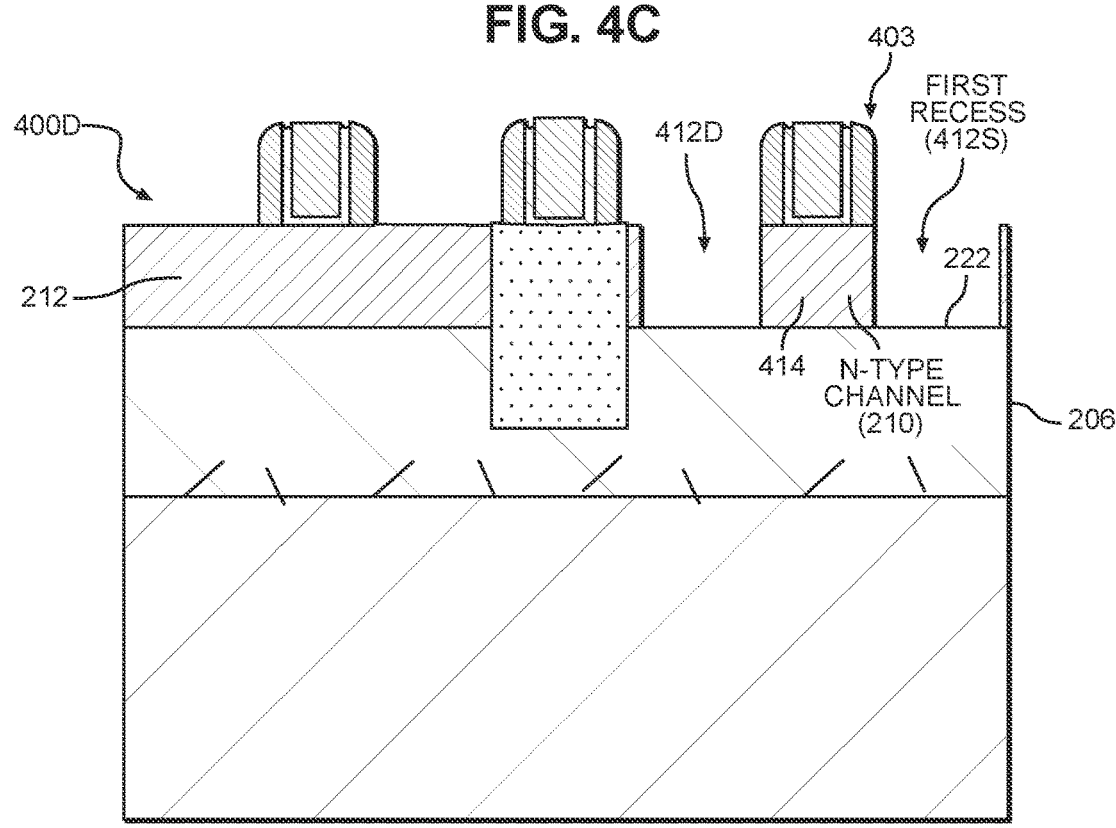

As shown in the illustration in FIG. 4D of the fourth fabrication stage 400D, the method 300 includes forming a first recess 412S on a first side of the gate 403 and a second recess 412D on a second side of the gate 403, the first recess 412S and the second recess 412D each extending through the semiconductor layer 212 to the buffer layer 206 (block 310). In an example, a portion 414 of the semiconductor layer 212 beneath the gate 403 is the N-type well 210 in FIG. 2. The first recess 412S and the second recess 412D may be removed by wet and/or dry etching, for example. Forming the first recess 412S and the second recess 412D exposes the top surface 222 of the buffer layer 206.

Figure 4E:
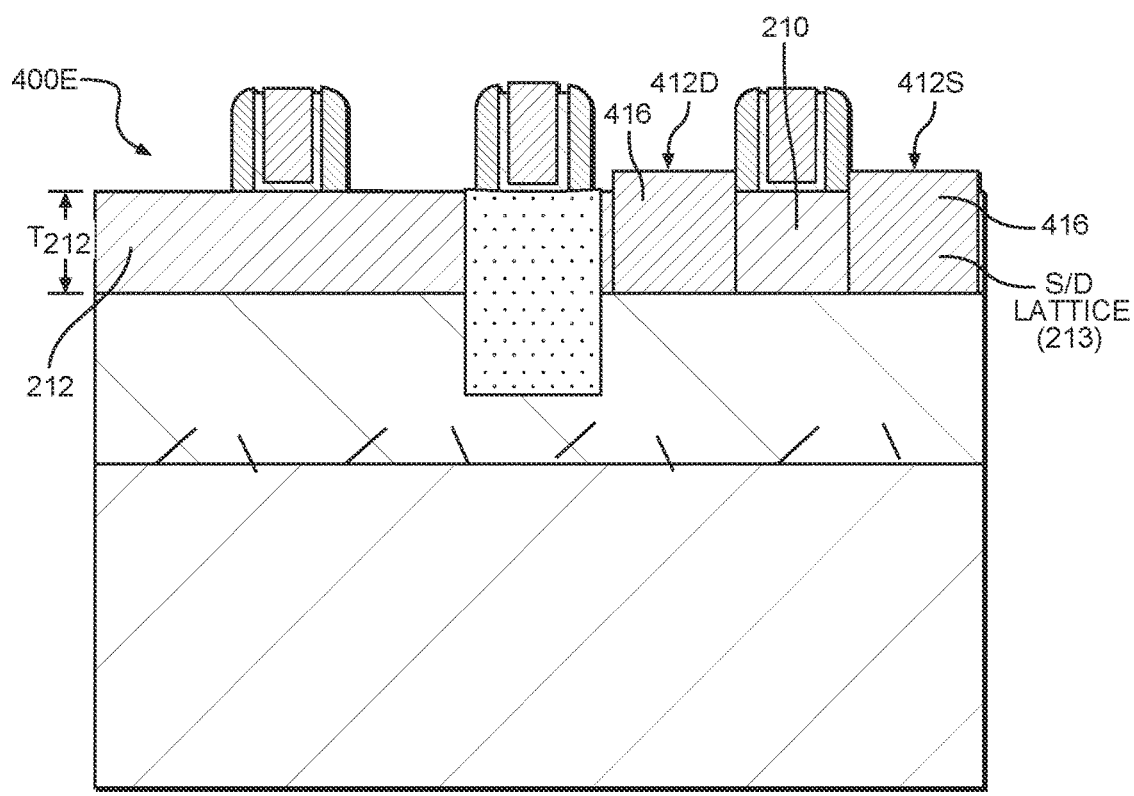

The illustration in FIG. 4E of the fifth fabrication stage 400E shows that the method 300 further includes forming a composite 416 of Si and Ge in the first recess 412S and the second recess 412D, the composite 416 comprising a second percentage of Ge greater than the first percentage of Ge, wherein the second percentage is at least 46% Ge (block 312). In an example, the composite 416 is the S/D lattice 213 in the first and second recesses 412S and 412D on the first side and the second side of the N-type well 210. In an example, the composite 416 is in direct contact with the N-type well 210. In an example, the composite 416 is grown by epitaxy to at least the thickness $T_{212}$ of the semiconductor layer 212.

Figure 4F:
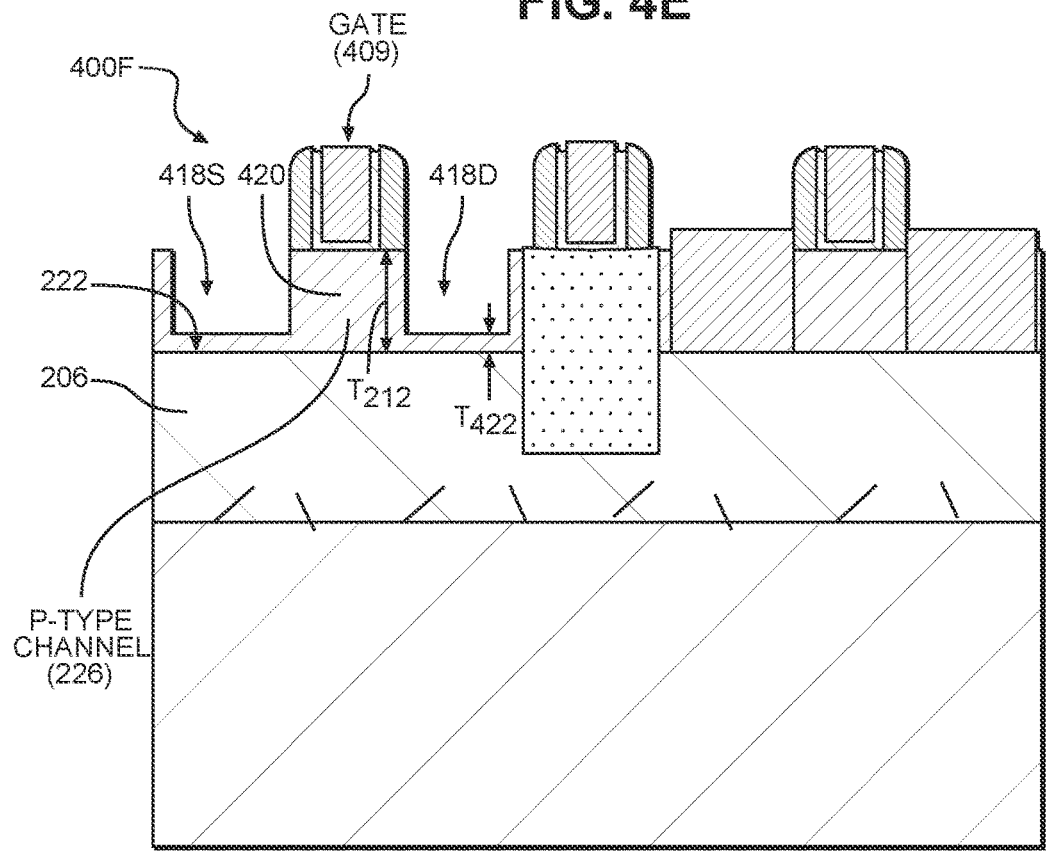

As shown in the illustration in FIG. 4F of the sixth fabrication stage 400F, the method 300 may further include forming a third recess 418S in the semiconductor layer 212 on a first side of the gate 409 and a fourth recess 418D in the semiconductor layer 212 on a second side of the gate 409, the third recess 418S and the fourth recess 418D each extending into but not through the semiconductor layer 212. In other words, the third and fourth recesses 418S and 418D do not extend all the way through the thickness $T_{212}$ of the semiconductor layer 212. In an example, a portion 420 of the semiconductor layer 212 beneath the gate 409 is the P-type well 226 in FIG. 2. The third recess 418S and the fourth recess 418D may be removed by wet and/or dry etching, for example. After forming the third recess 418S and the fourth recess 418D, a thickness $T_{422}$ of the semiconductor layer 212 remains on the top surface 222 of the buffer layer 206.

Figure 4G:
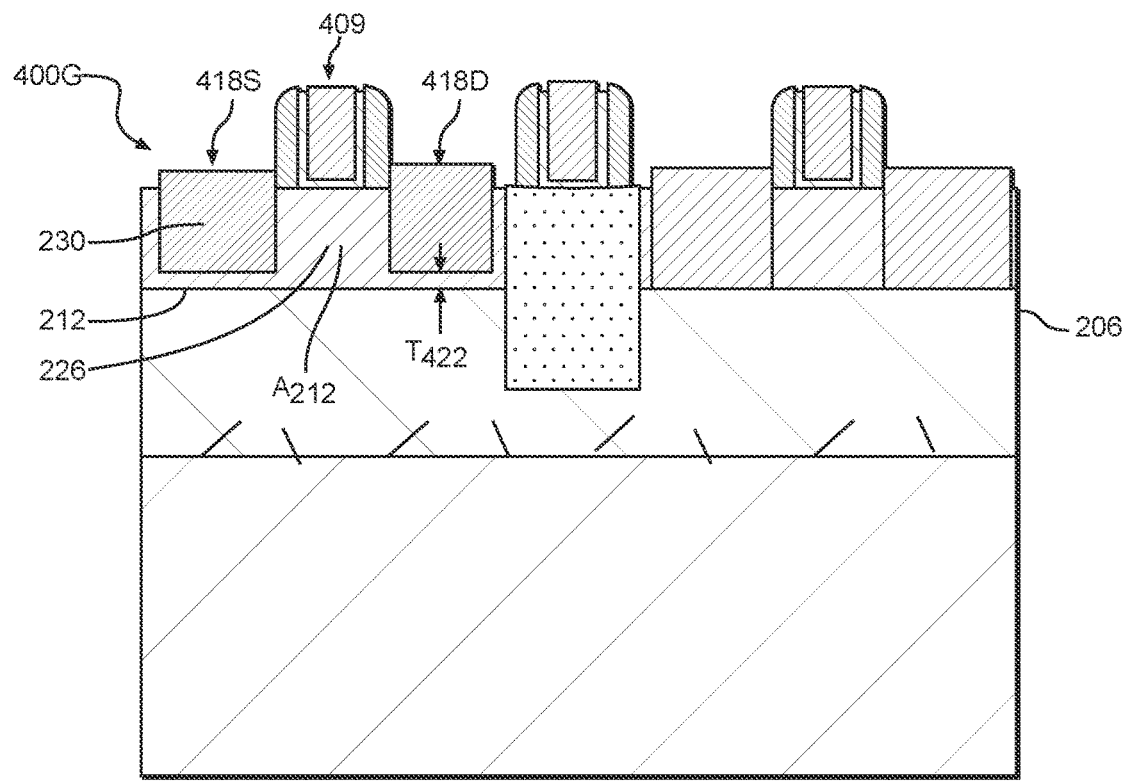

The illustration in FIG. 4G of the seventh fabrication stage 400G shows that the method 300 may further include forming a composite 230 of Si and another element 232 in the third recess 418S and the fourth recess 418D, the composite 230 comprising a smaller lattice constant than the lattice constant $A_{212}$ of the semiconductor layer 212. In an example, the other element is phosphorous and the composite 230 is a composite of Si and P. The composite 230 is formed on the first side and the second side of the P-type well 226. In an example, the composite 230 is in direct contact with the P-type well 226. The composite 230 of Si and the other element 232 is separated from the buffer layer 206 by the thickness $T_{422}$ of the semiconductor layer 212.

Figure 4H:
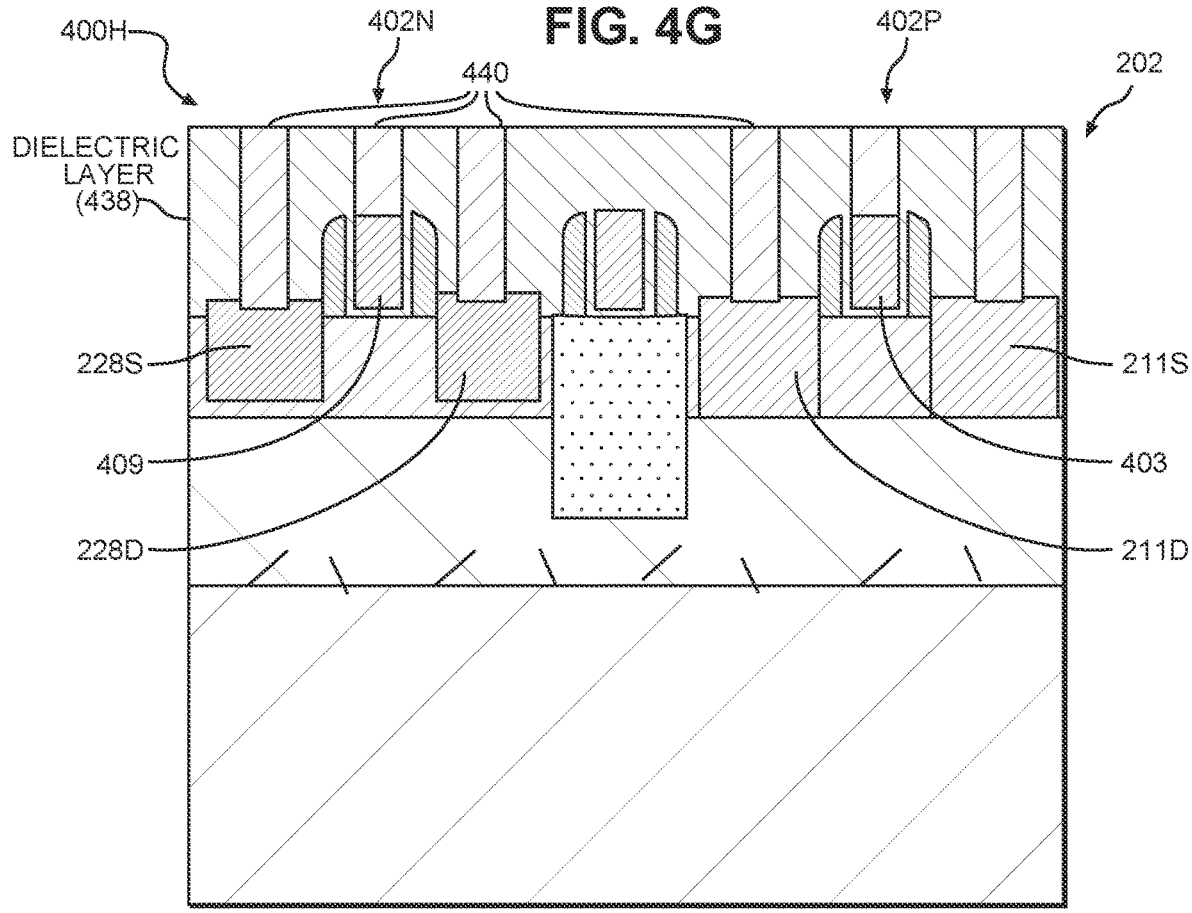

FIG. 4H is an illustration of the eighth fabrication stage 400H of a method 300 of fabricating the CMOS device 202. In this regard, the method includes forming a dielectric layer 438 above the area 402P and the area 402N and forming vertical contacts 440 through the dielectric layer 438. Vertical contacts 440 provide an electrical connection to each of the source 211S, gate 403, drain 200D, drain 228D, gate 409, and source 228S.

Figure 4I:
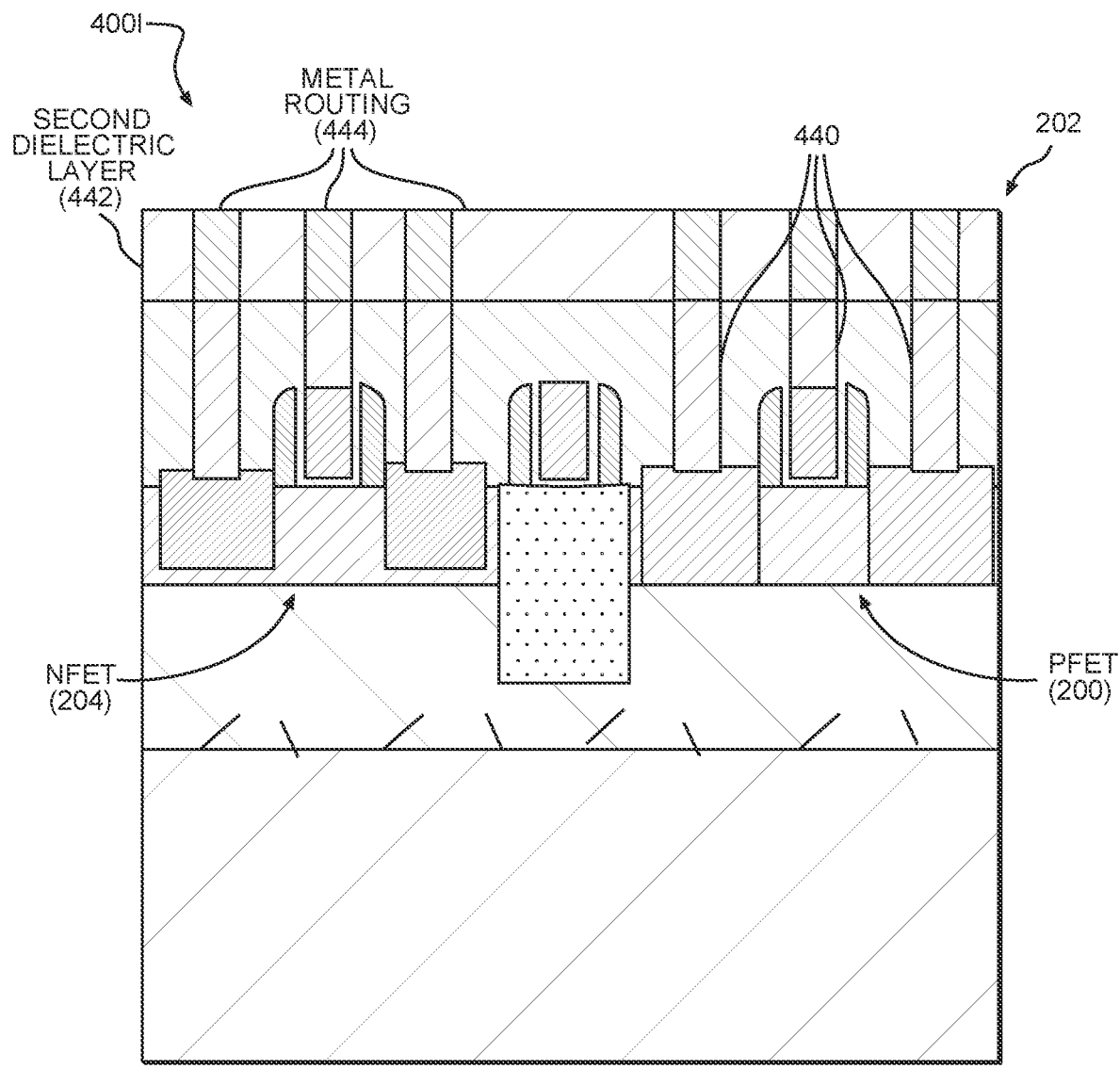

In the FIG. 4I illustrating the ninth fabrication state 400I of the method of fabricating the CMOS device 202, forming a second dielectric layer 442 and forming metal routing 444 in the second dielectric layer 442 for interconnecting the vertical contacts 440 of the PFET 200 and the NFET 204 to a circuit (not shown).

Figure 5:
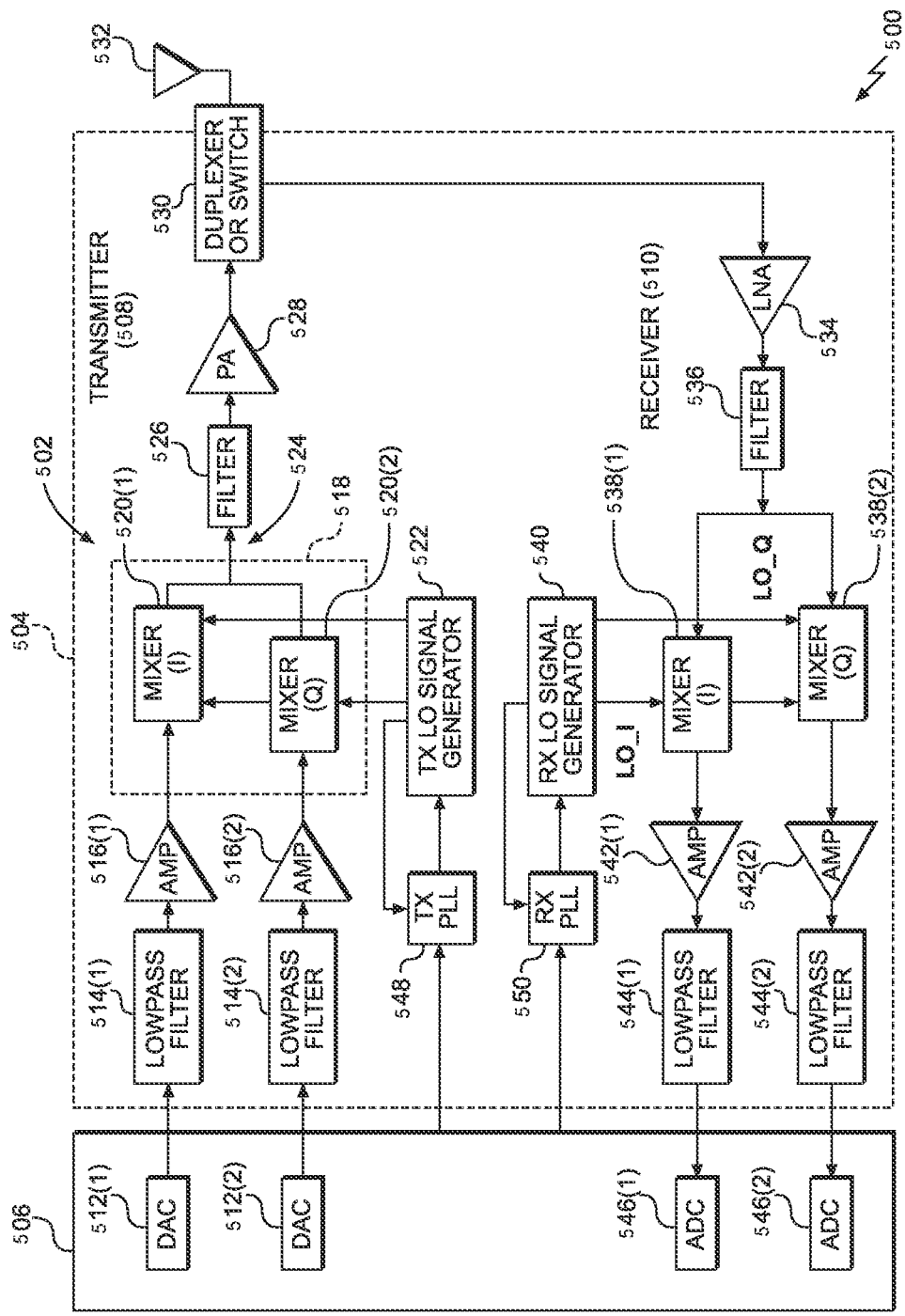
FIG. 5 is a block diagram of an exemplary wireless communications device that includes a radio-frequency (RF) module including the CMOS devices including the PFET and the NFET as illustrated in FIGS. 2 and 4I.

FIG. 5 illustrates an exemplary wireless communications device 500 that includes radio-frequency (RF) components formed from one or more integrated circuits (ICs) 502, wherein any of the ICs 502 can include an exemplary CMOS device including a PFET and an NFET formed on a SiGe composite buffer layer and including greater than 45% Ge in a SiGe composite in the PFET source and drain for increased performance, as illustrated in FIGS. 2 and 4A-4I, and according to any of the aspects disclosed herein. The wireless communications device 500 may include or be provided in any of the above-referenced devices, as examples. As shown in FIG. 5, the wireless communications device 500 includes a transceiver 504 and a data processor 506. The data processor 506 may include a memory to store data and program codes. The transceiver 504 includes a transmitter 508 and a receiver 510 that support bi-directional communications. In general, the wireless communications device 500 may include any number of transmitters 508 and/or receivers 510 for any number of communication systems and frequency bands. All or a portion of the transceiver 504 may be implemented on one or more analog ICs, RFICs, mixed-signal ICs, etc.

The transmitter 508 or the receiver 510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 500 in FIG. 5, the transmitter 508 and the receiver 510 are implemented with the direct-conversion architecture.

In the transmit path, the data processor 506 processes data to be transmitted and provides I and Q analog output signals to the transmitter 508. In the exemplary wireless communications device 500, the data processor 506 includes digital-to-analog converters (DACs) 512(1), 512(2) for converting digital signals generated by the data processor 506 into the I and Q analog output signals, e.g., I and Q output currents, for further processing.

Within the transmitter 508, lowpass filters 514(1), 514(2) filter the I and Q analog output signals, respectively, to remove undesired signals caused by the prior digital-to-analog conversion. Amplifiers (AMPs) 516(1), 516(2) amplify the signals from the lowpass filters 514(1), 514(2), respectively, and provide I and Q baseband signals. An upconverter 518 upconverts the I and Q baseband signals with I and Q transmit (TX) local oscillator (LO) signals from a TX LO signal generator 522 through mixers 520(1), 520(2) to provide an upconverted signal 524. A filter 526 filters the upconverted signal 524 to remove undesired signals caused by the frequency upconversion as well as noise in a receive frequency band. A power amplifier (PA) 528 amplifies the upconverted signal 524 from the filter 526 to obtain the desired output power level and provides a transmit RF signal. The transmit RF signal is routed through a duplexer or switch 530 and transmitted via an antenna 532.

In the receive path, the antenna 532 receives signals transmitted by base stations and provides a received RF signal, which is routed through the duplexer or switch 530 and provided to a low noise amplifier (LNA) 534. The duplexer or switch 530 is designed to operate with a specific receive (RX)-to-TX duplexer frequency separation, such that RX signals are isolated from TX signals. The received RF signal is amplified by the LNA 534 and filtered by a filter 536 to obtain a desired RF input signal. Downconversion mixers 538(1), 538(2) mix the output of the filter 536 with I and Q RX LO signals (i.e., LO_I and LO_Q) from an RX LO signal generator 540 to generate I and Q baseband signals. The I and Q baseband signals are amplified by AMPs 542(1), 542(2) and further filtered by lowpass filters 544(1), 544(2) to obtain I and Q analog input signals, which are provided to the data processor 506. In this example, the data processor 506 includes analog-to-digital converters (ADCs) 546(1), 546(2) for converting the analog input signals into digital signals to be further processed by the data processor 506.

In the wireless communications device 500 of FIG. 5, the TX LO signal generator 522 generates the I and Q TX LO signals used for frequency upconversion, while the RX LO signal generator 540 generates the I and Q RX LO signals used for frequency downconversion. Each LO signal is a periodic signal with a particular fundamental frequency. A TX phase-locked loop (PLL) circuit 548 receives timing information from the data processor 506 and generates a control signal used to adjust the frequency and/or phase of the TX LO signals from the TX LO signal generator 522. Similarly, an RX PLL circuit 550 receives timing information from the data processor 506 and generates a control signal used to adjust the frequency and/or phase of the RX LO signals from the RX LO signal generator 540.

Wireless communications devices 500 that each include an exemplary CMOS device including a PFET and an NFET formed on a SiGe composite buffer layer and including greater than 45% Ge in a SiGe composite in the PFET source and drain for increased performance, as illustrated in FIGS. 2 and 4A-4I, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
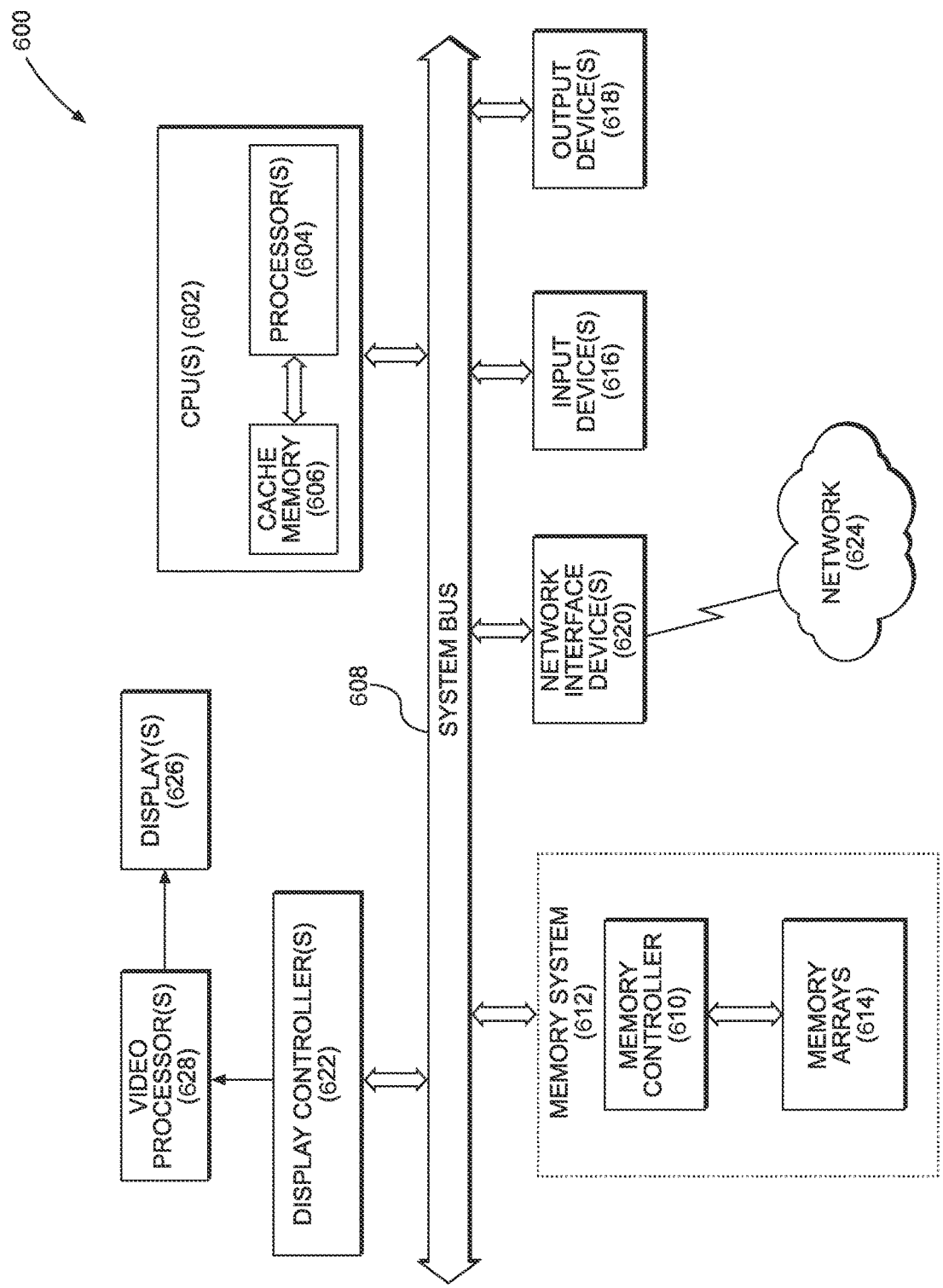
FIG. 6 is a block diagram of an exemplary IC package including CMOS devices including a PFET and an NFET formed on a SiGe buffer layer and including greater than 45% Ge in the PFET source and drain for increased performance, as illustrated in FIGS. 2 and 4I, and according to any of the aspects disclosed herein.

In this regard, FIG. 6 illustrates an example of a processor-based system 600 including an exemplary CMOS device including a PFET and an NFET formed on a SiGe composite buffer layer and including greater than 45% Ge in a SiGe composite in the PFET source and drain for increased performance, as illustrated in FIGS. 2 and 4A-4I, and according to any aspects disclosed herein. In this example, the processor-based system 600 includes one or more central processor units (CPUs) 602, which may also be referred to as CPU or processor cores, each including one or more processors 604. The CPU(s) 602 may have cache memory 606 coupled to the processor(s) 604 for rapid access to temporarily stored data. As an example, the processor(s) 604 could include an exemplary CMOS device including a PFET and an NFET formed on a SiGe composite buffer layer and including greater than 45% Ge in a SiGe composite in the PFET source and drain for increased performance, as illustrated in FIGS. 2 and 4A-4I, and according to any aspects disclosed herein. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612 that includes the memory controller 610 and one or more memory arrays 614, one or more input devices 616, one or more output devices 618, one or more network interface devices 620, and one or more display controllers 622, as examples. Each of the memory system 612, the one or more input devices 616, the one or more output devices 618, the one or more network interface devices 620, and the one or more display controllers 622 can include an exemplary CMOS device including a PFET and an NFET formed on a SiGe composite buffer layer and including greater than 45% Ge in a SiGe composite in the PFET source and drain for increased performance, as illustrated in FIGS. 2 and 4A-4I, and according to any of the aspects disclosed herein. The input device(s) 616 can include any type of input device, including, but not limited to, input keys, switches, voice processors, etc. The output device(s) 618 can include any type of output device, including, but not limited to, audio, video, other visual indicators, etc. The network interface device(s) 620 can be any device configured to allow exchange of data to and from a network 624. The network 624 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 620 can be configured to support any type of communications protocol desired.

The CPU(s) 602 may also be configured to access the display controller(s) 622 over the system bus 608 to control information sent to one or more displays 626. The display controller(s) 622 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc. The display controller(s) 622, display(s) 626, and/or the video processor(s) 628 can include an exemplary CIM bit cell array circuit including CIM bit cell circuits disposed in orientations of a CIM bit cell circuit physical layout including a read word line circuit to increase uniformity for improved performance and reliability, as illustrated in any of FIGS. 4, 8 and 9, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A semiconductor device, comprising:
    a silicon substrate;
    a buffer layer disposed on the silicon substrate, the buffer layer comprising a first percentage of germanium; and
    a transistor disposed on the buffer layer, the transistor comprising:
        a channel region comprising a semiconductor material;
        a gate disposed on the channel region;
        a source disposed on a first side of the channel region; and
        a drain disposed on a second side of the channel region;
        wherein:
            the source and the drain each comprises a silicon germanium (SiGe) composite comprising a second percentage of germanium, and the second percentage is greater than the first percentage.

2. The semiconductor device of clause 1, wherein the second percentage of germanium is at least forty-six percent.

3. The semiconductor device of clause 1 or 2, wherein the second percentage of germanium is greater than sixty percent.

4. The semiconductor device of any one of clause 1 to 3, wherein the source and the drain are doped with a trivalent impurity.

5. The semiconductor device of any one of clause 1 to 4, wherein the first percentage of germanium is fifteen percent.

6. The semiconductor device of any one of clause 1 to 5, wherein the buffer layer comprises a thickness of at least 1 micron.

7. The semiconductor device of any one of clause 1 to 6, wherein:
    the semiconductor material of the channel region comprises a thickness of 100 to 500 angstroms; and
    the source and the drain each comprises a thickness equal to or greater than the thickness of the semiconductor material of the channel region.

8. The semiconductor device of any one of clause 1 to 7, wherein the channel region, the source, and the drain are directly on the buffer layer.

9. The semiconductor device of any one of clause 1 to 8, further comprising a second transistor on the buffer layer, the second transistor comprising:
    a silicon layer on the buffer layer;
    a second gate disposed on a second channel region of the silicon layer;
    a second source disposed on one side of the second gate and recessed into the silicon layer on the one side of the second gate; and
    a second drain disposed on another side of the second gate and recessed into the silicon layer on the another side of the second gate.

10. The semiconductor device of clause 9, wherein:
    the transistor comprises a P-type field-effect transistor (FET) (PFET); and
    the second transistor comprises an N-type FET (NFET).

11. The semiconductor device of clause 9 or 10, wherein:
    the second source and the second drain of the second transistor comprise silicon and phosphorous.

12. The semiconductor device of any one of clause 1 to 11, integrated into a radio-frequency (RF) front end module.

13. The semiconductor device of any one of clause 1 to 12 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of fabricating a semiconductor device, the method comprising:
    forming a buffer layer on a silicon substrate, the buffer layer comprising silicon and a first percentage of germanium;
    relaxing strain in the buffer layer;
    forming a semiconductor layer on the buffer layer;
    forming a first gate on the semiconductor layer;
    forming a first recess on a first side of the first gate and a second recess on a second side of the first gate, the first recess and the second recess each extending through the semiconductor layer to the buffer layer; and
    forming a first composite of silicon and germanium in the first recess and in the second recess, the first composite comprising a second percentage of germanium higher than the first percentage of germanium.

15. The method of clause 14, wherein the second percentage of germanium is at least forty-six percent.

16. The method of clause 14 or 15, wherein relaxing the strain further comprises: creating defects in the buffer layer at an interface of the buffer layer and the silicon substrate; and annealing the buffer layer.

17. The method of any one of clause 14 to 16, wherein forming the semiconductor layer further comprises forming the semiconductor layer to a thickness of 100 angstroms to 500 angstroms.

18. The method of any one of clause 14 to 17, wherein forming the buffer layer further comprises forming the buffer layer to a thickness of 1 micron.

19. The method of any one of clause 14 to 18, further comprising:
   forming a second gate on the semiconductor layer;
   forming a third recess in the semiconductor layer on one side of the second gate;
   forming a fourth recess in the semiconductor layer on another side of the second gate; and
   forming a second composite of silicon and another element in the third recess and in the fourth recess, the second composite comprising a smaller lattice constant than a lattice constant of the semiconductor layer under the second gate.

20. The method of clause 19, wherein:
   the second composite of silicon and the another element is separated from the buffer layer by a portion of the semiconductor layer.

21. The method of clause 19 or 20, further comprising:
   forming an isolation trench between the first gate and the second gate, the isolation trench extending through the semiconductor layer and into the buffer layer.

What is claimed is:

1. A semiconductor device, comprising:
   a silicon substrate;
   a buffer layer disposed on the silicon substrate, the buffer layer comprising a first percentage of germanium;
   a silicon layer comprising a semiconductor material disposed on the buffer layer;
   a first transistor comprising:
      a first channel region of the silicon layer comprising the semiconductor material doped with a pentavalent impurity;
      a first gate disposed on the first channel region;
      a first source disposed on a first side of the first channel region on the buffer layer; and
      a first drain disposed on a second side of the first channel region on the buffer layer;
      wherein:
         the first source and the first drain each comprise a silicon germanium (SiGe) composite comprising a second percentage of germanium, and the second percentage is greater than the first percentage; and
   a second transistor comprising:
      a second channel region of the silicon layer comprising the semiconductor material doped with a trivalent impurity;
      a second gate disposed on the second channel region;
      a second source disposed on a first side of the second gate and recessed into the silicon layer on the first side of the second gate; and
      a second drain disposed on a second side of the second gate opposite the first side and recessed into the silicon layer on the second side of the second gate,
      wherein:
         a first portion of the silicon layer is disposed between the second source and the buffer layer; and
         a second portion of the silicon layer is disposed between the second drain and the buffer layer.

2. The semiconductor device of claim 1, wherein the second percentage of germanium is at least forty-six percent (46%).

3. The semiconductor device of claim 1, wherein the second percentage of germanium is greater than sixty percent (60%).

4. The semiconductor device of claim 1, wherein the first source and the first drain are doped with a trivalent impurity.

5. The semiconductor device of claim 1, wherein the first percentage of germanium is fifteen percent (15%).

6. The semiconductor device of claim 1, wherein the buffer layer comprises a thickness of at least one (1) micron.

7. The semiconductor device of claim 1, wherein:
   the semiconductor material of the first channel region comprises a thickness of 100 to 500 angstroms; and
   the first source and the first drain each comprise a thickness equal to or greater than the thickness of the semiconductor material of the first channel region.

8. The semiconductor device of claim 1, wherein:
   the first transistor comprises a P-type field-effect transistor (FET) (PFET); and
   the second transistor comprises an N-type FET (NFET).

9. The semiconductor device of claim 1, wherein:
   the second source and the second drain of the second transistor comprise silicon and phosphorous.

10. The semiconductor device of claim 1, integrated into a radio-frequency (RF) front-end module.

11. The semiconductor device of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *